(12) United States Patent
Townsend et al.

(10) Patent No.: US 12,164,103 B2
(45) Date of Patent: *Dec. 10, 2024

(54) COMPACT LINE SCAN MEMS TIME OF FLIGHT SYSTEM WITH ACTUATED LENS

(71) Applicants: STMicroelectronics (Research & Development) Limited, Marlow (GB); STMicroelectronics S.r.l., Agrate Brianza (IT)

(72) Inventors: Christopher Townsend, Edinburgh (GB); Roberto Carminati, Piancogno (IT)

(73) Assignees: STMicroelectronics (Research &Develoment) Limited, Marlow (GB); STMicroelectronics S.r.l., Agrate Brianza (IT)

(*) Notice: Subject to any disclaimer, the term of this patent is extended or adjusted under 35 U.S.C. 154(b) by 544 days.

This patent is subject to a terminal disclaimer.

(21) Appl. No.: 17/533,890

(22) Filed: Nov. 23, 2021

(65) Prior Publication Data

US 2022/0187591 A1    Jun. 16, 2022

Related U.S. Application Data

(63) Continuation-in-part of application No. 17/124,027, filed on Dec. 16, 2020, now Pat. No. 11,747,611.

(51) Int. Cl.
*G02B 26/08* (2006.01)
*B81B 3/00* (2006.01)

(52) U.S. Cl.
CPC ........ *G02B 26/0841* (2013.01); *B81B 3/0021* (2013.01); *B81B 2201/033* (2013.01)

(58) Field of Classification Search
None
See application file for complete search history.

(56) References Cited

U.S. PATENT DOCUMENTS 6,091,537 A    7/2000   Sun et al.
7,814,792 B2  10/2010   Tateyama et al.
(Continued)

FOREIGN PATENT DOCUMENTS

DE        19857946 C1     12/1998
DE     102018218166 A1     4/2020
(Continued)

OTHER PUBLICATIONS

Chi Zhang: "Two-Dimensional Micro Scanner Integrated with a Piezoelectric Actuator and Piezoresistors," Sensors, M D P I AG, CH, vol. 9, No. 1, Jan. 23, 2009, pp. 631-644, XP002620220.
(Continued)

*Primary Examiner* — Jennifer D. Carruth
(74) *Attorney, Agent, or Firm* — Crowe & Dunlevy LLC (57) ABSTRACT

Disclosed herein is an optical module including a substrate, with an optical detector, laser emitter, and support structure being carried by the substrate. An optical layer includes a fixed portion carried by the support structure, a movable portion affixed between opposite sides of the fixed portion by a spring structure, and a lens system carried by the movable portion. The movable portion has at least one opening defined therein across which the lens system extends, with at least one supporting portion extending across the at least one opening to support the lens system. The optical layer further includes a MEMS actuator for in-plane movement of the movable portion with respect to the fixed portion.

25 Claims, 10 Drawing Sheets

(56) References Cited

U.S. PATENT DOCUMENTS

| | | |
|---|---|---|
| 7,849,741 B2 | 12/2010 | Tateyama et al. |
| 8,559,086 B2 | 10/2013 | Davis et al. |
| 8,654,426 B2 | 2/2014 | Yamada |
| 8,730,549 B2 | 5/2014 | Aimono |
| 8,817,351 B2 | 8/2014 | Koyama |
| 9,151,947 B2 | 10/2015 | Aimono |
| 9,291,817 B2 | 3/2016 | Hashiguchi et al. |
| 9,383,578 B2 | 7/2016 | Tanaka et al. |
| 9,470,503 B2 | 10/2016 | Gerson |
| 9,593,013 B2 | 3/2017 | Iyad Al Dibs et al. |
| 9,729,038 B2 | 8/2017 | Takimoto et al. |
| 9,739,998 B2 | 8/2017 | Muchow et al. |
| 10,063,849 B2 | 8/2018 | Pacala et al. |
| 10,690,754 B2 | 6/2020 | Pei et al. |
| 10,698,114 B2 | 6/2020 | Keilaf et al. |
| 2004/0211256 A1 | 10/2004 | Geen |
| 2005/0081397 A1 | 4/2005 | Bonham et al. |
| 2006/0181756 A1 | 8/2006 | Yamazaki |
| 2007/0223080 A1 | 9/2007 | Hagood, IV et al. |
| 2011/0199284 A1 | 8/2011 | Davis et al. |
| 2011/0292479 A1 | 12/2011 | Hiraoka et al. |
| 2012/0162739 A1 | 6/2012 | Yamada |
| 2012/0327494 A1 | 12/2012 | Koyama |
| 2012/0327495 A1 | 12/2012 | Aimono |
| 2013/0083378 A1 | 4/2013 | Tanaka et al. |
| 2013/0208330 A1 | 8/2013 | Naono |
| 2013/0301102 A1 | 11/2013 | Kamiya et al. |
| 2013/0301103 A1 | 11/2013 | Aimono |
| 2013/0308173 A1 | 11/2013 | Muchow et al. |
| 2014/0117888 A1 | 5/2014 | Iyad Al Dibs et al. |
| 2015/0077823 A1 | 3/2015 | Hashiguchi et al. |
| 2015/0124304 A1 | 5/2015 | Tanaka et al. |
| 2015/0241196 A1 | 8/2015 | Gerson |
| 2015/0270477 A1 | 9/2015 | Horie et al. |
| 2017/0160540 A1 | 6/2017 | Giusti et al. |
| 2019/0324143 A1 | 10/2019 | Gimpel |
| 2020/0241113 A1 | 7/2020 | Cullumber et al. |
| 2021/0157067 A1* | 5/2021 | Moebius ............ G02B 26/0808 |

FOREIGN PATENT DOCUMENTS

| | | |
|---|---|---|
| EP | 2811331 A1 | 12/2014 |
| JP | 2012088487 A | 5/2012 |
| KR | 20130038751 A | 4/2013 |
| WO | 2020049055 A1 | 3/2020 |

OTHER PUBLICATIONS

Cho, Ah Ran et al: "Electromagnetic Biaxial Microscanner With Mechanical Amplification at Resonance," Optics Express 16792, vol. 23, No. 13, Jun. 17, 2015, (11 pages).

EPO Search Report and Written Opinion for family-related application, EP Appl. No. 21212140.4, report dated Apr. 20, 2022, 10 pgs.

* cited by examiner

COMPACT LINE SCAN MEMS TIME OF FLIGHT SYSTEM WITH ACTUATED LENS

RELATED APPLICATION

This application is a continuation-in-part of U.S. patent application Ser. No. 17/124,027, filed Dec. 16, 2020, the contents of which are incorporated by reference in their entirety to the maximum extent allowable under the law.

TECHNICAL FIELD

This disclosure is related to the field of time of flight imaging systems and, in particular, to a compact time of flight system utilizing MEMS technology to scan a transmit lens and a receive lens across a pulsed laser generator and a high speed photodetector to enable depth measurement of a scene.

BACKGROUND

Time-of-flight (TOF) imaging techniques are used in many depth mapping systems (also referred to as 3D mapping or 3D imaging). In so-called "direct" TOF techniques, a light source, such as a pulsed laser, directs pulses of optical radiation toward the scene that is to be mapped, and a high-speed detector senses the time of arrival of the optical radiation reflected back from the scene. The depth value at each pixel in the depth map is derived from the difference between the emission time of the outgoing pulse of optical radiation and the arrival time of the optical radiation reflected from the corresponding point in the scene, which is referred to as the "time of flight" of the optical pulses.

For some desired applications, in order to meet desired performance and resolution metrics, it is desired to scan the optical light source across the scene, and to properly receive the optical radiation reflected back from the scene during that scan. As an example, the light source and high-speed detector may be scanned with respect to optical lenses through which the outgoing pulses of optical radiation and incoming optical radiation reflected back from the scene.

However, current scanning techniques may consume an undesired amount of area. In addition, the thickness of optical modules used with such techniques is greater than desired Given that depth mapping systems are typically incorporated into compact electronic devices, the excess area consumption and excess thickness is particularly undesirable. As such, development into compact TOF systems utilizing a scanning solution to depth map a scene is necessary, and it is desirable for such compact TOF systems to maintain the robustness of existing systems.

SUMMARY

An optical module includes: a substrate; an optical detector carried by the substrate; a laser emitter carried by the substrate; a support structure carried by the substrate; and an optical layer. The optical layer includes: a fixed portion carried by the support structure; a movable portion affixed between opposite sides of the fixed portion by a spring structure; a lens system carried by the movable portion, the lens system including an objective lens portion and a beam shaping lens portion, the objective lens portion being positioned such that it overlies the optical detector, the beam shaping lens portion being positioned such that it overlies the laser emitter; and a MEMS actuator for in-plane movement of the movable portion with respect to the fixed portion.

The MEMS actuator may include a comb drive. The comb drive may be formed by: a first comb structure extending from the fixed portion to interdigitate with a second comb structure extending from the movable portion; and actuation circuitry configured to apply voltages to the first and second comb structures to cause the movable portion of the optical layer to oscillate back and forth between opposite sides of the fixed portion such that at a first travel limit the movable portion of the optical layer is closer to the a first side of the fixed portion than to a second side of the fixed portion, and such that at a second travel limit the movable portion of the optical layer is closer to the second side of the fixed portion than to the first side of the fixed portion.

The MEMS actuator may be formed by: a first comb structure extending from a first side of the fixed portion to interdigitate with a second comb structure extending from an adjacent side of the movable portion; a third comb structure extending from a second side of the fixed portion to interdigitate with a fourth comb structure extending from an adjacent side of the movable portion; and actuation circuitry configured to apply voltages to the first, second, third, and fourth comb structures to cause the movable portion of the optical layer to oscillate back and forth between opposite sides of the fixed portion such that at a first travel limit the movable portion of the optical layer is closer to a first side of the fixed portion than to a second side of the fixed portion, and such that at a second travel limit the movable portion of the optical layer is closer to the second side of the fixed portion than to the first side of the fixed portion.

The optical detector may be a two dimensional array of single photon avalanche diodes arranged to match an expected diffraction pattern displayed by light incident thereon.

The laser emitter may be a one dimensional array of vertical cavity surface emitting lasers (VCSELs).

The spring structure may be a MEMS spring structure.

The fixed portion, movable portion, and spring structure may be integrally formed as a monolithic unit.

An encapsulating layer may be carried by the fixed portion and overlying the lens system.

The lens system may include a metasurface optic.

The lens system may include an objective lens and a beam shaping lens spaced apart from the objective lens.

The lens system may be carried by a top surface of the movable portion, and a back surface of the movable portion may be thinned opposite portions of the movable portion where the objective lens portion and beam shaping lens portion reside.

The movable portion may include a shuttle carrying the lens system, with the spring structure comprising first, second, third, and fourth flexures respective extending from different corners of the shuttle to anchor at different corners of the fixed portion.

The first, second, third, and fourth flexures may be S-shaped.

The shuttle may include a first shuttle portion carrying the objective lens portion, a second shuttle portion carrying the beam shaping lens portion, and a connector portion extending between the first and second shuttle portions, with a width of the connector portion being less than a width of the first and second shuttle portions.

The shuttle may have first and second openings defined therein in which the objective lens portion and the beam shaping lens portion are carried The shuttle may be formed by first and second spaced apart shuttle portions.

The lens system may include a glass substrate carried by the moving portion, with the objective lens portion and the beam shaping lens portion being carried by the glass substrate.

An additional glass substrate may be carried by the support structure, the additional glass substrate carrying the optical layer.

Also disclosed herein is an optical module, including: a substrate; an optical detector carried by the substrate; a laser emitter carried by the substrate; a support structure carried by the substrate; and an optical layer. The optical layer may include: a fixed portion carried by the support structure; a movable portion affixed between opposite sides of the fixed portion by a spring structure; a lens system carried by the movable portion; wherein the movable portion has at least one opening defined therein across which the lens system extends, with at least one supporting portion extending across the at least one opening to support the lens system; and a MEMS actuator for in-plane movement of the movable portion with respect to the fixed portion.

The at least one supporting portion may extend parallel to an axis of movement of the movable portion.

The at least one supporting portion may include a plurality of supporting portions.

The plurality of supporting portions may include at least some supporting portions extending parallel to an axis of movement of the movable portion.

The plurality of supporting portions may include at least some other supporting portions extending perpendicular to an axis of the movement of the movable portion.

The plurality of supporting portions may include at least some supporting portions extending antiparallel to an axis of movement of the movable portion.

The plurality of supporting portions may include at least some supporting portions extending elliptically about a central point of the lens system.

The first portion, the movable portion, the at least one supporting portion, and the spring structure may be integrally formed as a monolithic unit.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
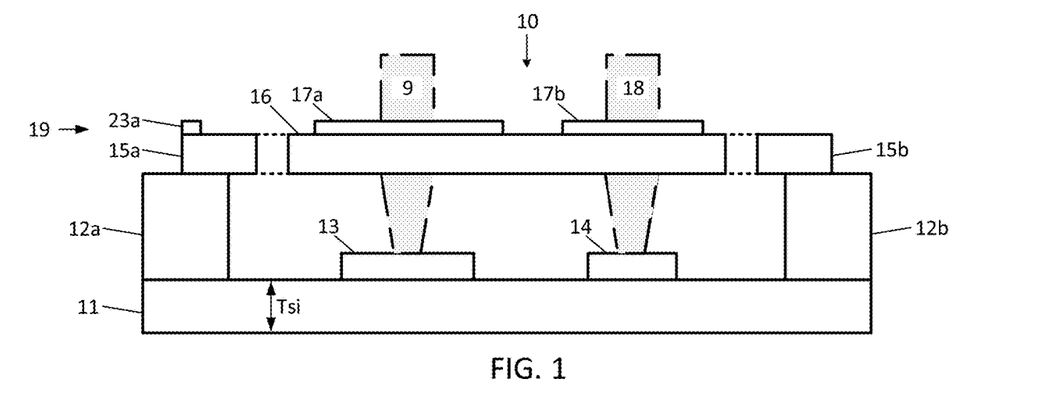
FIG. 1 is a cross sectional view of an embodiment of a microelectromechanical system (MEMS) based optical module for a time of flight (TOF) system.

Now described with reference to FIG. 1 is a MEMS based optical module 10 for use in a TOF system. The optical module 10 includes a substrate 11, such as silicon or an organic material, on which a high speed optical detector integrated circuit (IC) 13 and a laser emitter array integrated circuit (IC) 14 are mounted. As an example, the MEMS based optical module 10 may be realized using an assembly process in which the high speed optical detector IC 13 and laser emitter array IC 14 are mounted by die attach to the substrate 11, utilizing back-end processing techniques.

Figure 1A:
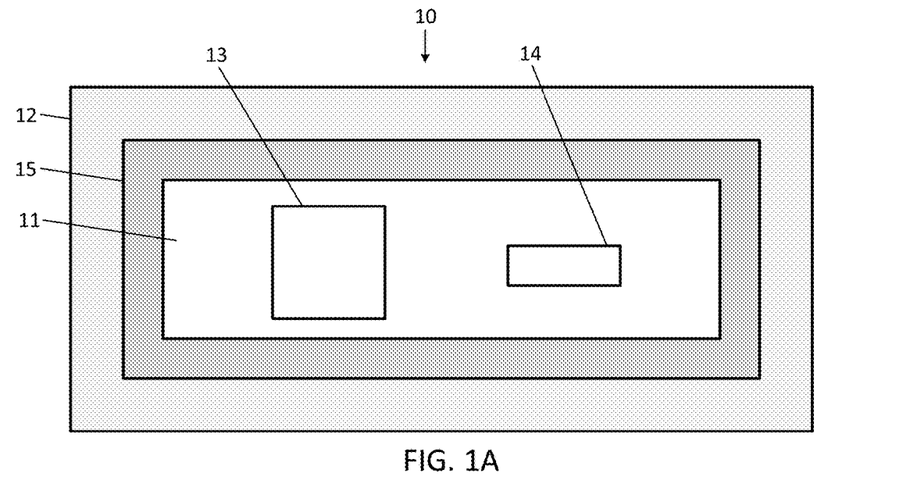
FIG. 1A is a top view of the MEMS based optical module of FIG. 1.

The high speed optical detector IC 13 may be comprised of a two-dimensional array of single photon avalanche diodes (SPADs), and the laser emitter array IC 14 may be comprised of an array (one dimensional or two dimensional)

of vertical cavity surface emitting lasers (VCSELs). Support structures 12a and 12b are carried by the substrate 11 on opposite sides of the optical detector IC 13 and laser emitter array IC 14, and may also be formed from silicon, metal, or plastics. The support structures 12a and 12b may be opposite sides of a frame shaped support structure 12, as shown in FIG. 1A An optic layer 19 is carried by the support structures 12a and 12b. The optic layer 19 is comprised of fixed portions 15a and 15b carried by the respective support structures 12a and 12b. The fixed portions 15a and 15b may be formed from silicon. The fixed portions 15a and 15b may be opposite sides of a frame shaped fixed portion 15, as shown in FIG. 1A.

Between the fixed portions 15a and 15b is a moving portion 16, which may also be formed by silicon or by an optically transparent material. Although not shown in FIG. 1, as will be explained below, MEMS flexures extend from the moving portion 16 to anchor points on the fixed portions 15a and 15b, and when the moving portion 16 is actuated, serve to permit movement of the moving portion 16 in the positive and negative x-direction (away from one fixed portion 15a and toward the other fixed portion 15b, then away from the fixed portion 15b and back toward the fixed portion 15a, and so on). Lenses 17a and 17b are carried by the moving portion 16, with lens 17a being positioned on the moving portion 16 so that it overlies the optical detector IC 13, and lens 17b being positioned on the moving portion 16 so that it overlies the laser emitter array IC 14. Note that lens 17a is sized such that, regardless of the position of the moving portion 16 as it moves, light 9 incident on the lens 17a is bent by the lens 17a such that it impinges upon the optical detector IC 13, and such that light 18 emitted by the laser emitter IC array IC 14 is bent by the lens 17b such that it is directed at a desired angle toward the scene (for example, in the z-direction).

Lens 17a is an objective lens and focuses the light reflected from the scene to the optical detector IC 13, and may be a multi-level diffractive optic or a metasurface. The light reflected from the scene has a pattern of parallel lines, due to the pattern of the lasers of the laser emitter array IC 14, explained below. The incident light reflected from the scene at which it was directed by the laser emitter array IC 14 and lens 17b may be seen in FIG. 2, where it can observed that the incident light 19 has been focused into the pattern of parallel lines on the optical detector IC 13 shown in FIG. 2. Note that in some cases, the SPADs of the optical detector IC 13 may be pre-arranged into this pattern at the time of the formation of the optical detector IC 13.

Figure 2:
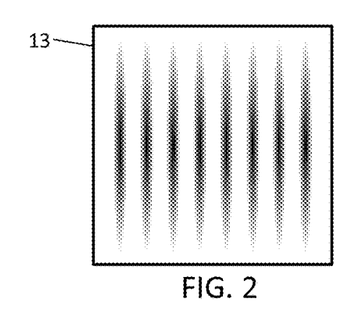
FIG. 2 is a top view of the reflected optical radiation incident on the optical detector of FIG. 1, after it has passed through a diffractive optic.
Figure 3:
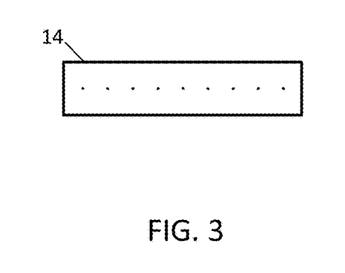
FIG. 3 is a top view of the laser emitters forming the light source of FIG. 1.

Lens 17b is a beam shaping optic and is shaped and formed so as to collimate the laser light 18 emitted by the VCSELs of the laser emitter array IC 14 along a direction parallel to the MEMS scan direction, and to expand the circular beam of each laser shown in FIG. 3 along a direction perpendicular to this direction. As a result, as shown in FIG. 2, a light pattern comprised of a set of parallel lines is obtained. This pattern is scanned along the MEMS scanning direction by the movement of the moving portion 16. The lens 17b may also be a multi-level diffractive optic or a metasurface. Note that the laser emitter array IC 14 may be a one dimensional array or line of VCSELs.

Figure 4:
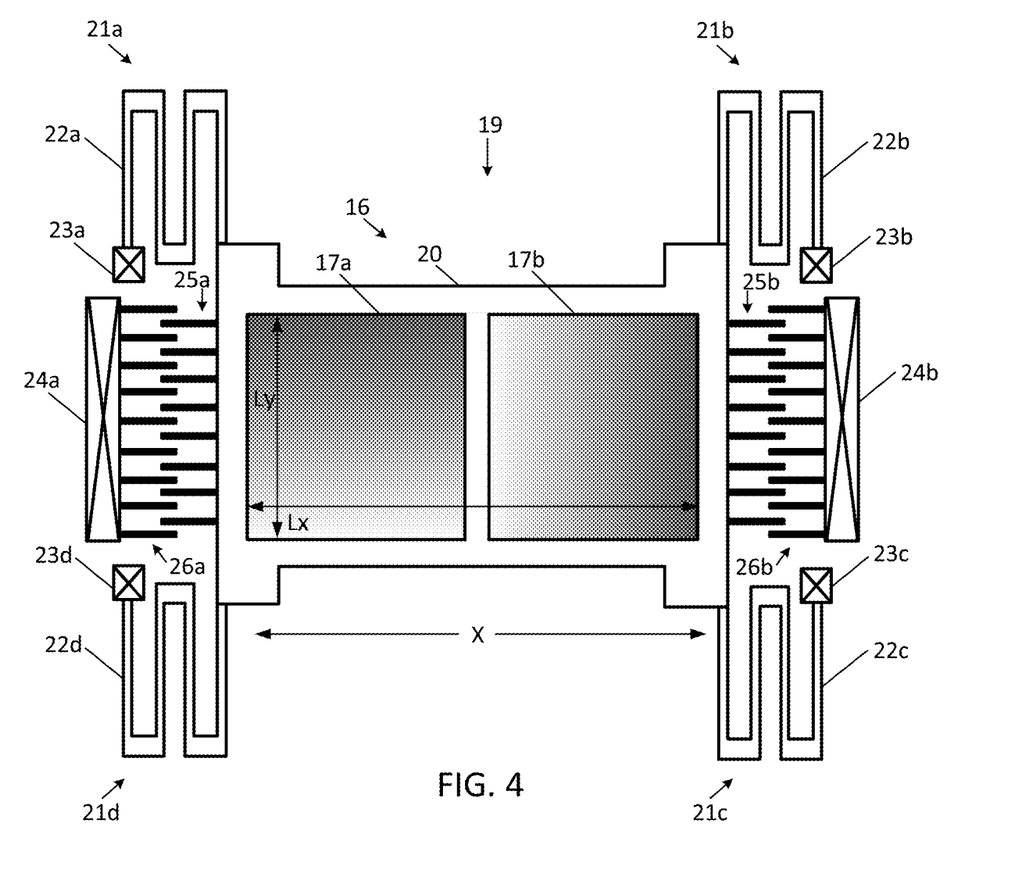
FIG. 4 is a top view of a first possible arrangement for the layer containing the MEMS actuators and optic carrying shuttle of FIG. 1.

A top view of one potential arrangement for the optic layer 19 may be seen in FIG. 4. The moving portion 16 includes a shuttle 20, with the lenses 17a and 17b affixed within openings in the shuttle 20. Flexures 22a-22d formed using MEMS technology extend in a squared off S-pattern from the corners of the shuttle 20 to anchor points 23a-23d that are affixed to the fixed portions 15a and 15b, with anchor point 23a and 23d being affixed to fixed portion 15a, and anchor points 23b and 23c being affixed to fixed portion 15b. Note that the flexures 22a-22d are actually integrally formed with the shuttle 20 and fixed portions 15a and 15b as a monolithic unit, and therefore extend from the shuttle 20 to the fixed portions 15a and 15b instead of being affixed to the shuttle 20 and fixed portions 15a and 15b.

Conductive combs 25a and 25b extend from the sides of the shuttle 20, and are interdigitated with conductive combs 26a and 26b that extend from comb drive actuators 24a and 24b that are respectively affixed to the fixed portions 15a and 15b. The combs 25a and 25b are integrally formed with the shuttle 20 and flexures 22a-22d as a monolithic unit, and therefore they are short circuited together and set at a constant reference voltage (e.g., ground) by biasing the fixed portions 15a and 15b at which they are connected. The electrical routing is realized through the flexures 22a-22d themselves. The comb drive actuators 24a and 24b are circuits configured to apply a voltage (a DC bias with a superimposed AC drive waveform) to the combs 26a and 26b so that a comb drive is formed, and the shuttle 20 is moved back and forth in the x-direction via electrostatic actuation to thereby scan the laser pulses emitted by the laser emitter array IC 14 across the scene to permit detection of reflections therefrom by the optical detector IC 13 to collecting depth information about the scene. Note that since the lenses 17a and 17b are on the same shuttle 20, both the light emitted by the laser emitter array IC 14 and the light collected at the optical detector 13 is scanned synchronously, so that the optical detector 13 views the portion of the scene illuminated by the laser emitter array IC 14 at any given movement and in such a way that less background light than reflected laser light is collected, since the optical detector 13 is viewing but a portion of the scene at a given time.

In the above examples, the thickness tsi of the substrate 11 may be on the order of 200 µm to 300 µm. The thickness of the layers 15 and 16 may be on the order of 60 µm. In addition, the length Lx of the lenses 17a and 17b may be 3.25 mm, and the width Ly of the lenses 17a and 17b may be 2.5 mm.

Figure 5:
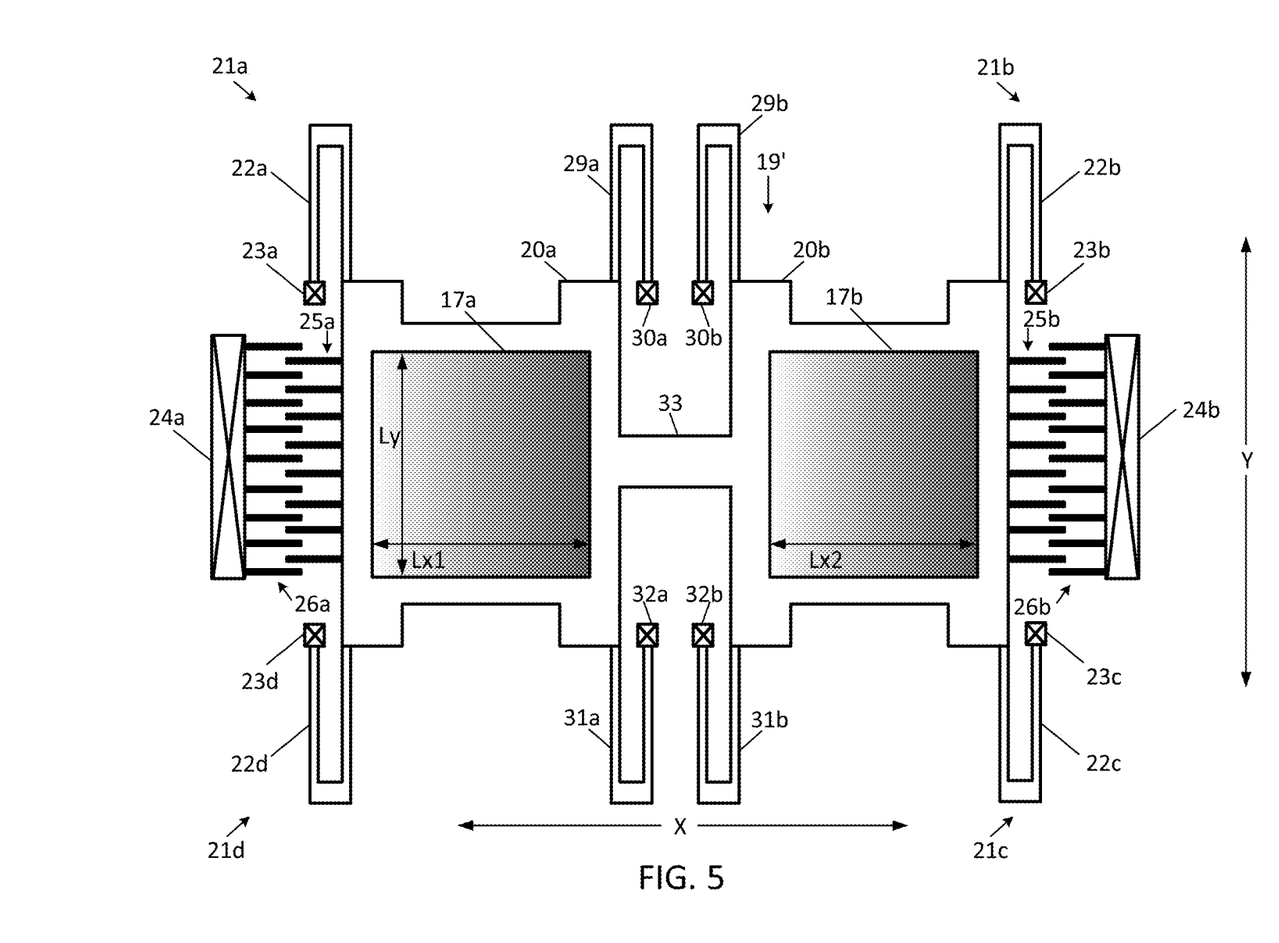
FIG. 5 is a top view of a second possible arrangement for the layer containing the MEMS actuators and optic carrying shuttle of FIG. 1.

A variant of the optical layer 19' is seen in FIG. 5. Here, the shuttle is divided into a first shuttle portion 20a carrying the lens 17a, and a second shuttle portion 20b carrying the lens 17b, with a connector portion 33 extending between the first shuttle portion 20a and second shuttle portion 20b. Note that the connector portion 33 is narrower in the z-direction than the first shuttle portion 20a and second shuttle portion 20b, and is integrally formed with the first and second shuttle portions as a monolithic unit. Note here that in addition to the flexures 22a-22d extending from the outside corners of the first shuttle portion 20a and seconds shuttle portion 25b, flexures 29a and 31a extend from the inside corners of the first shuttle portion 20a, while flexures 29b and 31b extend from the inside corners of the second shuttle portion 20b. Each flexure 22a-22d, 29a-29b, and 31a-31b is U-shaped, and extends toward respective anchor points 23a-23d, 30a-30b, and 32a-32b. Flexures 22a, 22d, 29a, 31a are integrally formed with shuttle portion 20a as a monolithic unit, and flexures 22b, 22c, 29b, 31 b are integrally formed with shuttle portion 20b as a monolithic unit. Operation of the optical layer 19' is the same as the optical layer 19 described above.

Figure 6:
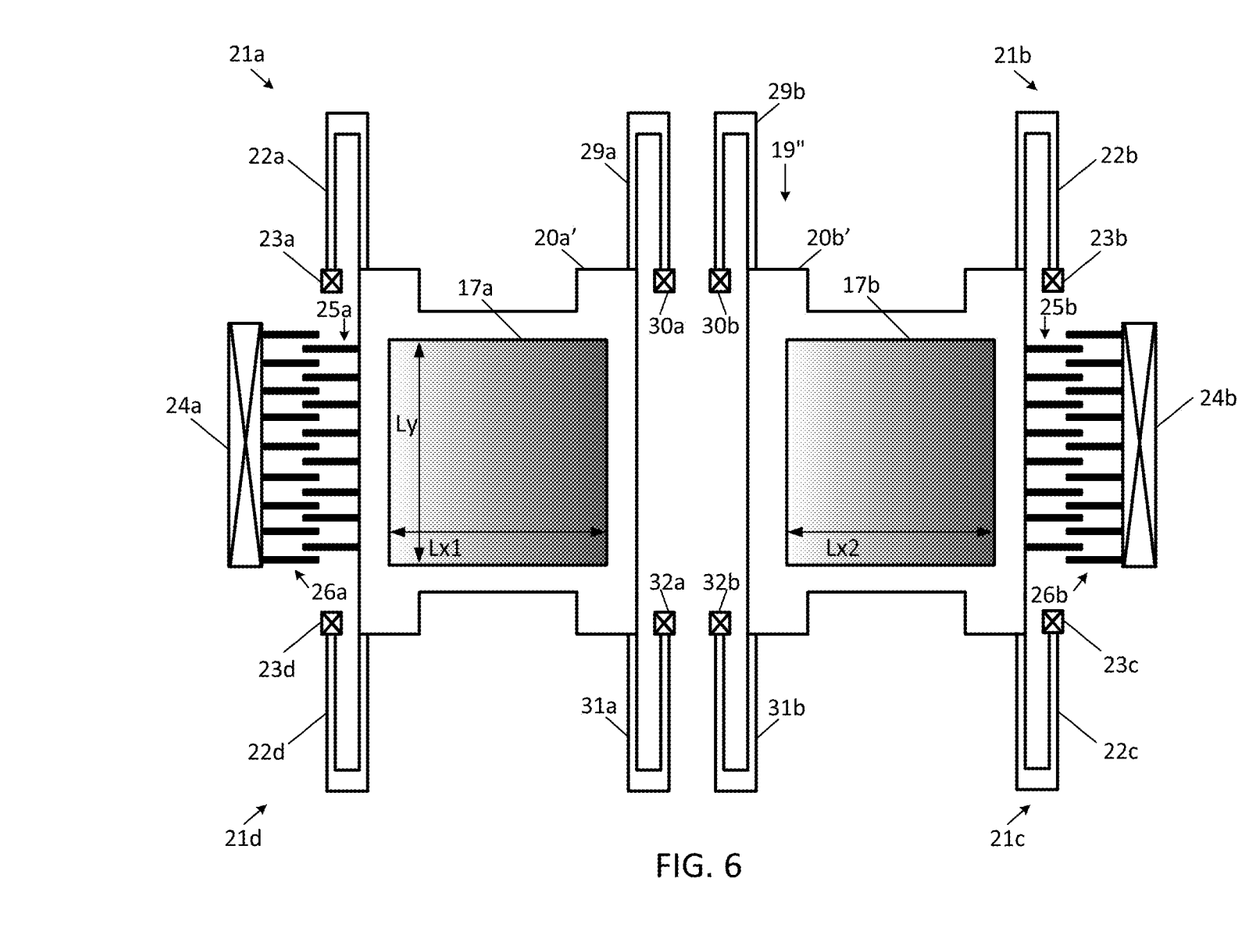
FIG. 6 is a top view of a third possible arrangement for the layer containing the MEMS actuators and optic carrying shuttle of FIG. 1.

Another variant of the optical layer 19" is seen in FIG. 6. Here, it can be observed that, as compared to the optical layer 10' of FIG. 5, there is no connector portion 33, and that shuttle portions 20a' and 20b' are separate unconnected components. Keeping in mind that the fixed portion 15 may be shaped as a frame (FIG. 1A), the anchor points 30a and 30b, and 32a and 32b are connected to and supported by the fixed portion 15. Note here that while the lenses 17a and 17b are scanned synchronously, this is not accomplished passively by being carried by the same shuttle, but is instead accomplished by the driving of the comb drive being such that the first shuttle portion 20a' and second shuttle portion 20b' move synchronously.

Figure 7:
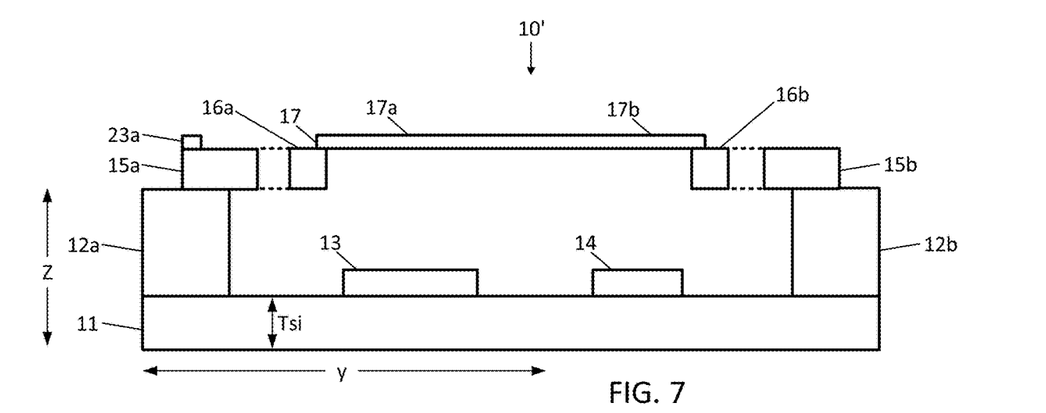
FIG. 7 is a cross sectional view of an additional embodiment of a MEMS based optical unit for a TOF system, such as may use the arrangements of FIGS. 4-6 for its layer containing the MEMS actuators and optic carrying shuttle.

In a situation where it would be desired for the shuttle 20 to be opaque, as shown in FIG. 7, the moving portion may be separated into two disconnected and spaced apart moving portions 16a and 16b by completely removing portions of the fixed portion from the side thereof opposite the lenses 17 (here, the lenses 17a and 17b are formed as one metalens with a diffractive portion 17a and a collimating portion 17b), such as by using silicon deep reactive ion etching. As an alternative, windows may be formed within the moving portion 16, and the lenses 17a and 17b are held within those windows.

Figure 8:
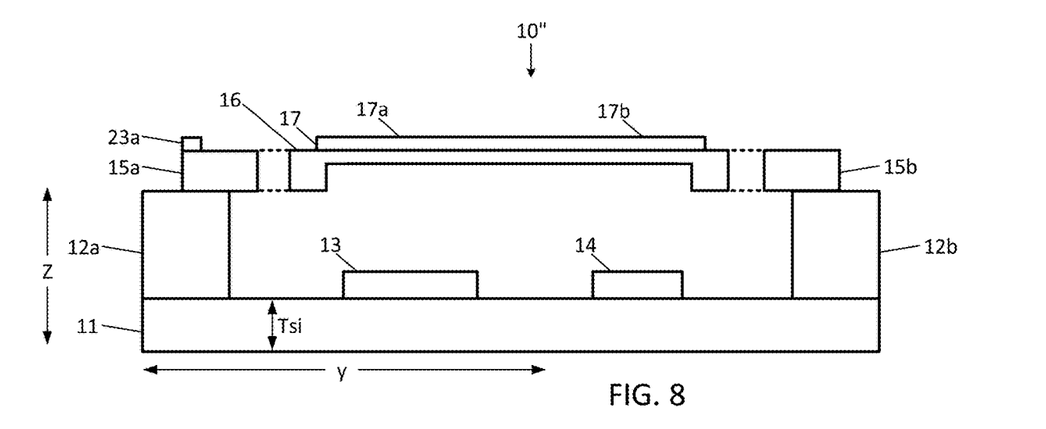
FIG. 8 is a cross sectional view of an another embodiment of a MEMS based optical unit for a TOF system, such as may use the arrangements of FIGS. 4-6 for its layer containing the MEMS actuators and optic carrying shuttle.

As an alternative as shown in FIG. 8, a thin layer (e.g., 1-5 microns thick) of the moving portion 16 may be left adjacent the diffractive portion 17a and collimating portion 17b if the moving portion 16 is formed from silicon.

Figure 9:
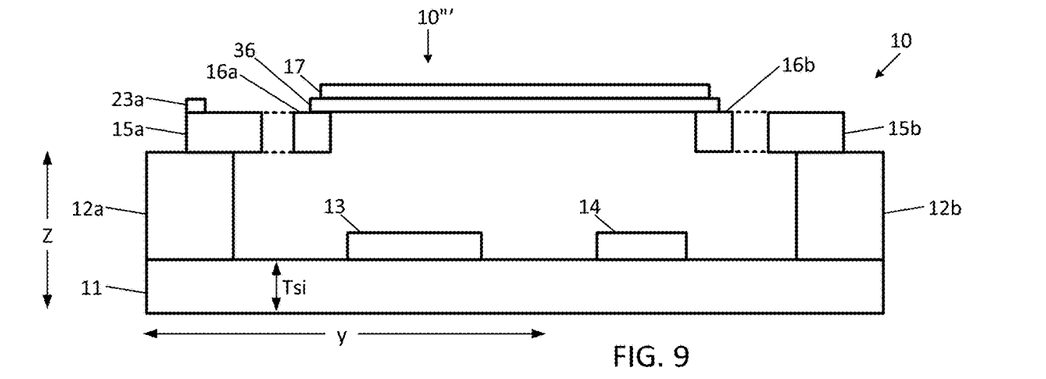
FIG. 9 is a cross sectional view of a further embodiment of a MEMS based optical unit for a TOF system, such as may use the arrangements of FIGS. 4-6 for its layer containing the MEMS actuators and optic carrying shuttle.

As another alternative shown in FIG. 9, moving portion 16 is separated into two spaced apart moving portions 16a and 16b, with a glass substrate 36 extending on top of and between the moving portions 16a and 16b, and the lens 17 being carried by the glass substrate 36.

In any arrangement described herein, the moving portion 16 may have first and second openings defined therein for carrying the lenses 17a and 17b.

Figure 10:
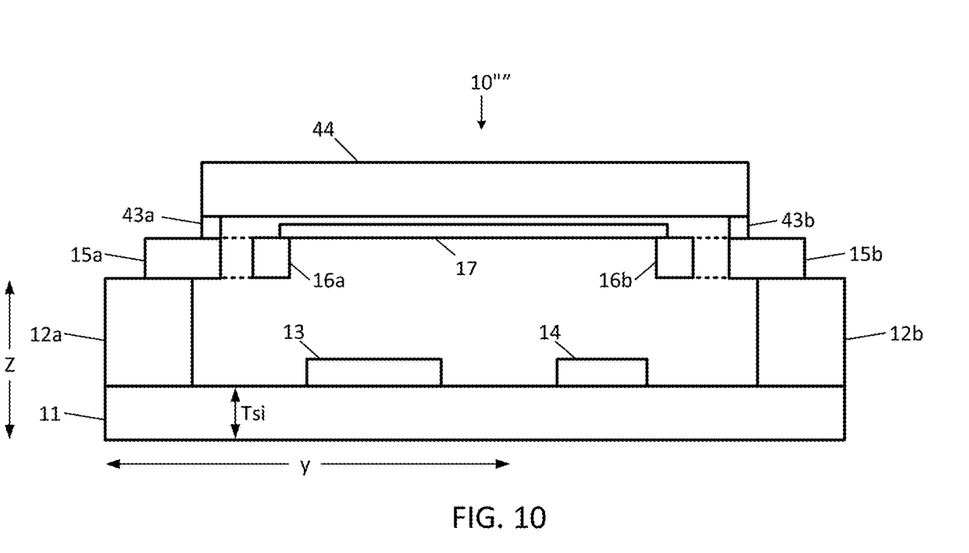
FIG. 10 is a cross sectional view of the embodiment of the MEMS based optical unit of FIG. 7, encapsulated by a glass layer.
Figure 11:
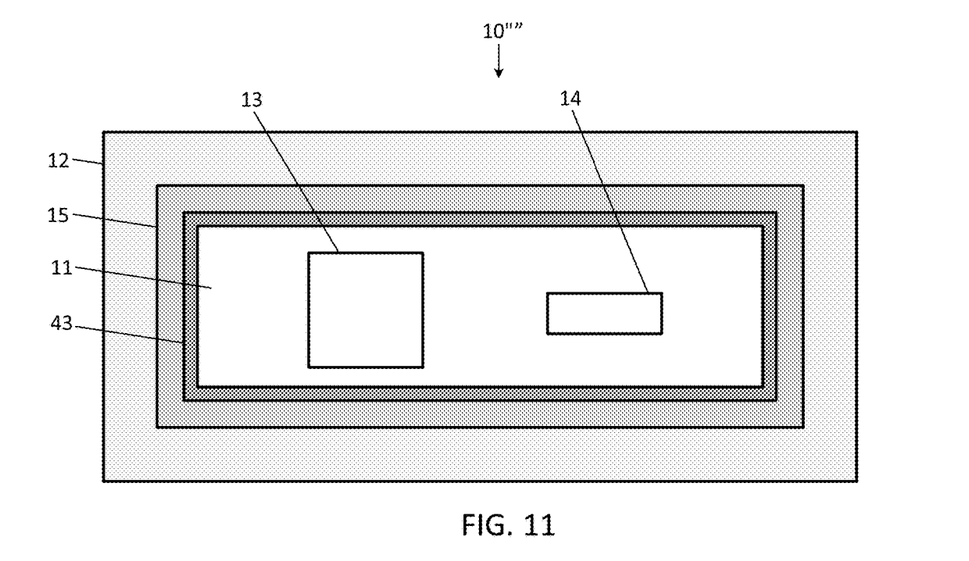
FIG. 11 is a top view of the MEMS based optical unit of FIG. 10.

Note that any of the variants of the optical layer described above may be encapsulated by a glass layer 44 carried by support blocks 43a and 43b which are in turn carried by the spaced apart fixed portions 15a and 15b, as shown in FIG. 10. A top view of this embodiment may be found in FIG. 11, where it can be observed that the support structures 12a and 12b may be opposite sides of a frame shaped support structure 12, the fixed portions 15a and 15b may be opposite sides of a frame shaped fixed portion 15, and the support blocks 43a and 43b may be opposite sides of a frame shaped support block 43.

Figure 12:
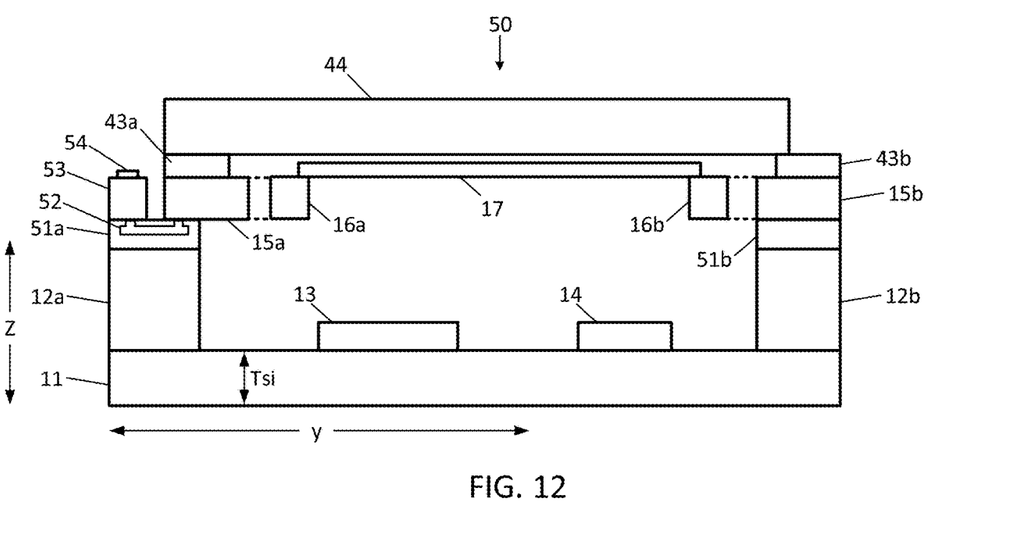
FIG. 12 is a cross sectional view of yet another embodiment of a MEMS based optical unit for a TOF system, such as may use the arrangements of FIGS. 4-6 for its layer containing the MEMS actuators and optic carrying shuttle.

A variant of the design of FIG. 10 is shown in FIG. 12, where in the illustrated optical module 50, the fixed portions 15a and 15b are carried by support portions 51a and 51b (that also may be opposite sides of a frame shaped support portion), and that electrical routing 52 may extend through the support portion 51a between the fixed portion 15a and a terminal carrying block 53, with a metal pad 54 for wire bonding being carried by the terminal carrying block 53 and electrically coupled to the electrical routing 52.

Figure 13:
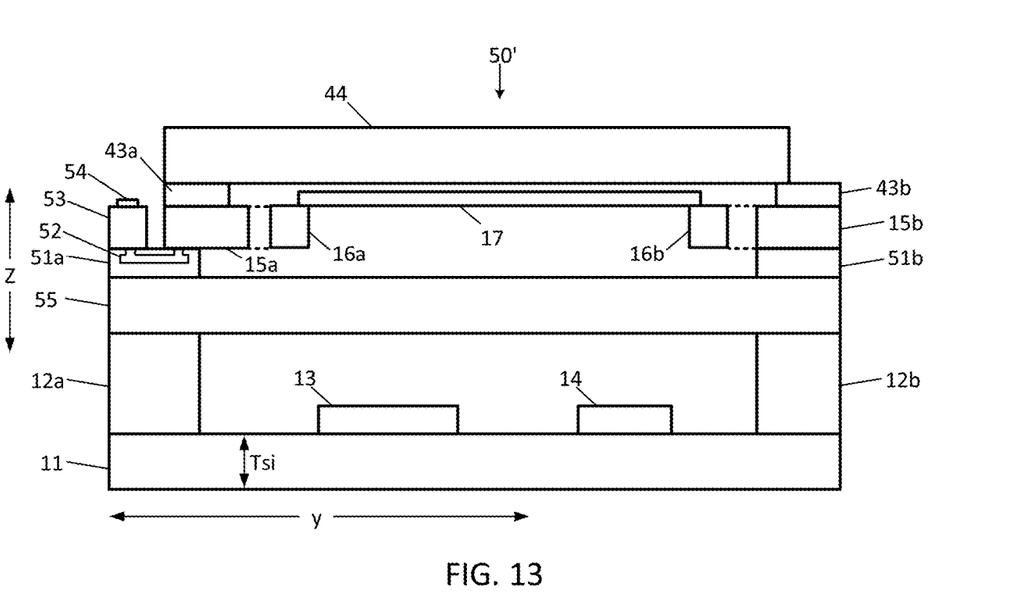
FIG. 13 is a cross sectional view of a variant of the embodiment of FIG. 12, where the optic layer and MEMS layer are encapsulated by glass substrates.

A further embodiment of the optical module 50' is shown in FIG. 13, where, instead of the glass substrate 44 encapsulating the lens 17, optical detector 13, and laser emitter array 14 against the substrate 11, the support portions 51a and 51b are carried by a second glass substrate 55, which is in turn carried by the support structures 12a and 12b extending from the substrate 11. Therefore, in this embodiment, the lens 17, fixed portions 15a and 15b, and moving portions 16a and 16b are encapsulated by glass on both sides, providing enhanced environmental protection. This embodiment also allows for low pressure operation, increasing efficiency. Also note here that this structure may be used in applications unrelated to depth sensing, such as picoprojection. In such a case, the optical detector 13 is removed, and the size of the other components adjusted accordingly.

Figure 14:
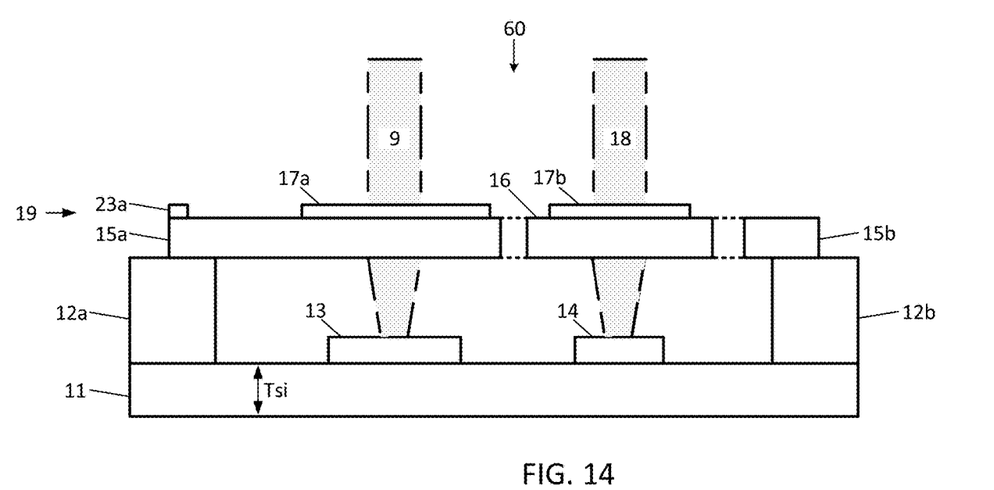
FIG. 14 is a cross sectional view of a variant of the embodiment of FIG. 1, where the lens overlying the laser emitter array is moved by the shuttle while the lens overlying the optical sensor remains stationary.

Returning now to the general design of FIG. 1, a variant is shown in FIG. 14. Here, the lens 17a is still contained within the optic layer 19, but is attached to and carried by the fixed portion 15a. Therefore, here, the lens 17a is not moved, while the lens 17b is still moved as described above.

Figure 15:
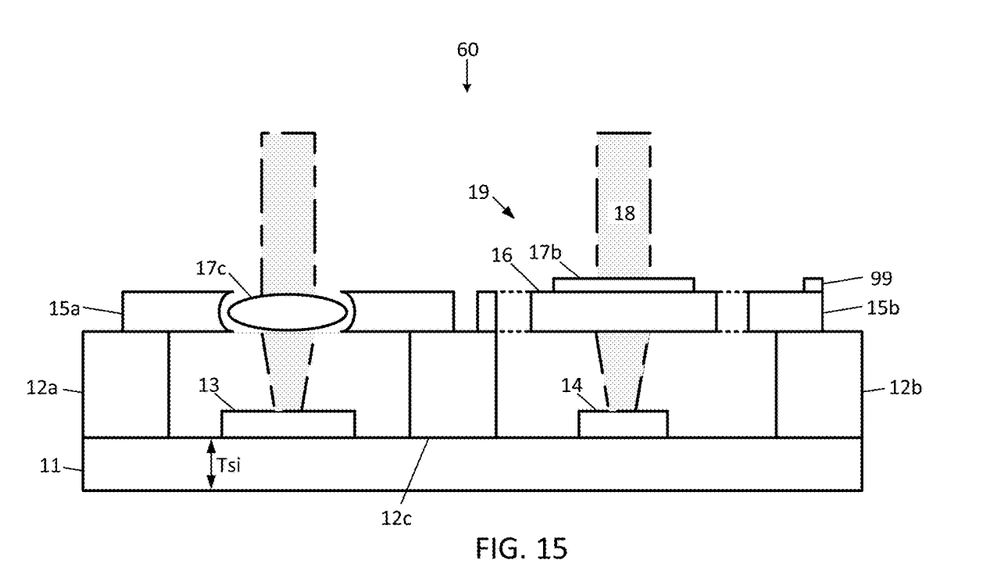
FIG. 15 is a cross sectional of another variant of the embodiment of FIG. 1, where the lens overlying the laser emitter array is moved by the shuttle while the lens overlying the optical sensor is a conventionally formed lens and remains stationary.

As a further alternative shown in FIG. 15, rather than a lens 17a being within the optic layer 19a, the fixed portion 15a is frame shaped and separated from the fixed portion 15b, and contains a standard imaging lens 17c. Therefore, here, the lens 17c is now moved, while the lens 17b is still moved as described above. Here, a bonding pad 99 is carried by the fixed portion 15a, and used for applying a drive signal to the MEMS actuator.

In the above examples, the moving portion 16 is moved by a comb drive, but it should be understood that any MEMS actuation technique may be used. For example, thermal, magnetic, and piezoelectric actuation may be used to move the moving portion 16 with respect to the fixed portion 15.

In the example optical modules described above, notice that in some instances, the metalens 17 (forming the lenses 17a and 17b, and best shown for this description in FIGS. 7, 10, and 12-13) is suspended between the disconnected and spaced apart moving portions 16a and 16b. Therefore, since the metalens 17 is thin, having a thickness on the order of 1 mm to 3 mm, it could break during manufacturing or operation. As such, it may be desirable to correct this fragility of the metalens 17 without reducing its optical transparency or with a minimal reduction in its optical transparency.

Certain ways of accomplishing this have been described above. For example, in the embodiment of FIG. 8, a thin layer (e.g., 1-5 microns thick) of the moving portion 16 is left adjacent the metalens 17, with the moving portion 16 being formed from silicon in this instance. This thin layer is left to provide support to the metalens 17. As another example, in the embodiment of FIG. 9, the metalens 17 is carried by a glass substrate 36, with the glass substrate 36 being suspended between the disconnected and spaced apart moving portions 16a and 16b. The glass substrate 36 may be thicker than the metalens 17 and may have a greatest resistance to fracture and cracking than the metalens 17, and therefore provides support for the metalens 17.

Other approaches to providing support to the metalens 17 may be desirable, depending upon application and manufacturing constraints. A first such example of an optical module 50" in which the metalens 17 is provided with support is now described with reference to FIG. 16. This optical module 50" illustratively has the same structure as that of FIG. 12, with the addition of reinforcing elements 99a-99c between the spaced apart moving portions 16a and 16b and supporting the metalens 17 at its bottom surface (the bottom surface facing the substrate 11). The reinforcing elements 99a-99c are spaced such that the reinforcing element 99a closest to the moving portion 16a is spaced apart from the moving portion 16a by a gap Wgap, the reinforcing element 99a is spaced apart from the reinforcing element 99b by Wgap, the reinforcing element 99b is spaced apart from the reinforcing element 99c by Wgap, and the reinforcing element 99c is spaced apart from the moving portion 16b by Wgap. The width of the reinforcing elements 99a-99c in the y-direction is Wreinf.

Figure 16:
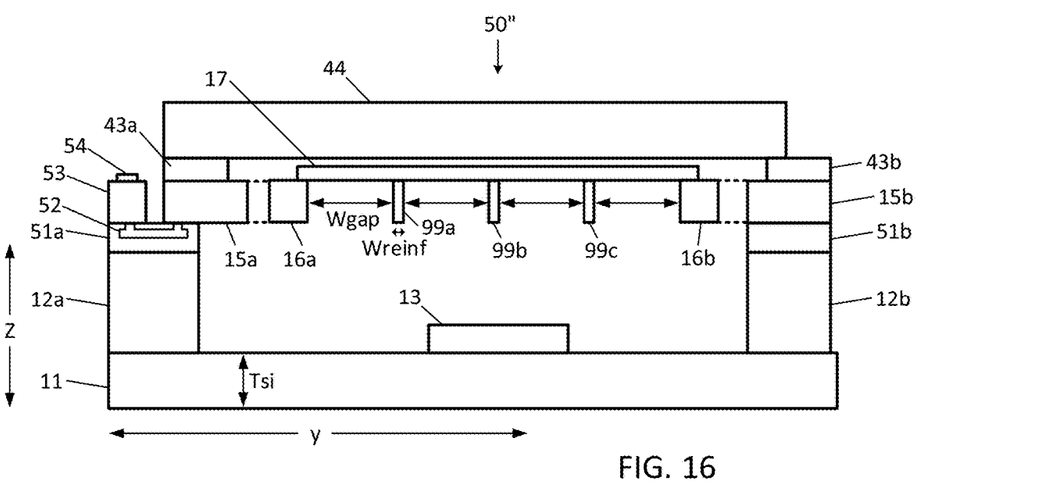
FIG. 16 is a cross sectional view of a further variant of the embodiment of FIG. 12 where supporting portions extend parallel to the axis of movement to support the lens.

The width Wreinf of the reinforcing elements 99a-99c is substantially smaller than the width Wgap, for example, Wreinf≤0.25×Wgap, so as to allow suitable transmissivity of incoming and outgoing light through the metalens 17. The transmissibility of light through the metalens 17 can be calculated as Wgap/(Wgap+Wreinf). Example values may be Wgap=95 µm, Wreinf=5 µm, such that a sample transmissibility of light through the metalens 17 with the use of the reinforcing elements 99a-99c is still 95%, while providing the metalens 17 with substantial protection against fracture and cracking.

Figure 17A:
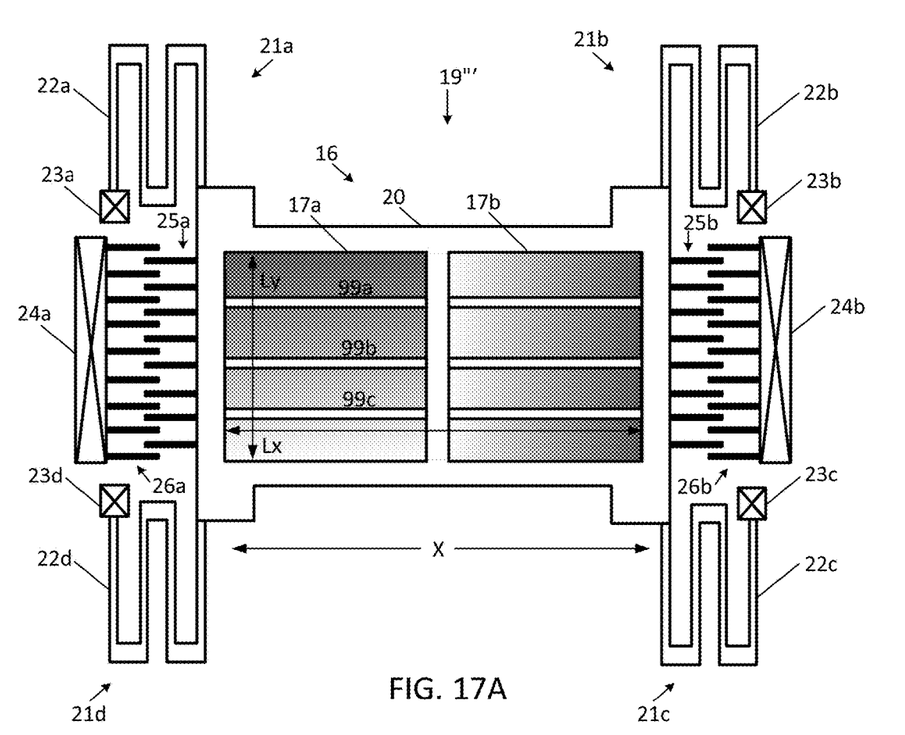
FIG. 17A is a top view of a first possible arrangement for the layer containing the MEMS actuators and optic carrying shuttle of FIG. 16.

A top view of the optical layer 19''' within the optical module 50" may be seen in FIG. 17A, where it can be observed that the reinforcing elements 99a-99c extend across the x-axis from a first end of the shuttle 20 to a second end of the shuttle 20, keeping in mind that the shuttle 20 is part of the moving portion 16. Since the x-axis is the axis of movement, in this example, the reinforcing elements 99a-99c extend parallel to the axis of movement of the moving portion 16.

Although three reinforcing elements 99a-99c have been illustrated and described in this example, keep in mind that any suitable number of reinforcing elements may be used so as to achieve the desired protection with a given minimum acceptable transmissibility of light through the metalens 17.

The reinforcing elements 99a-99c may be constructed from the same material as the moving portion 16. Indeed, the reinforcing elements 99a-99c may be parts of the moving portion 16 that are purposely not removed during formation, and therefore may be integrally formed with the moving portion 16 as a monolithic unit.

Figure 17B:
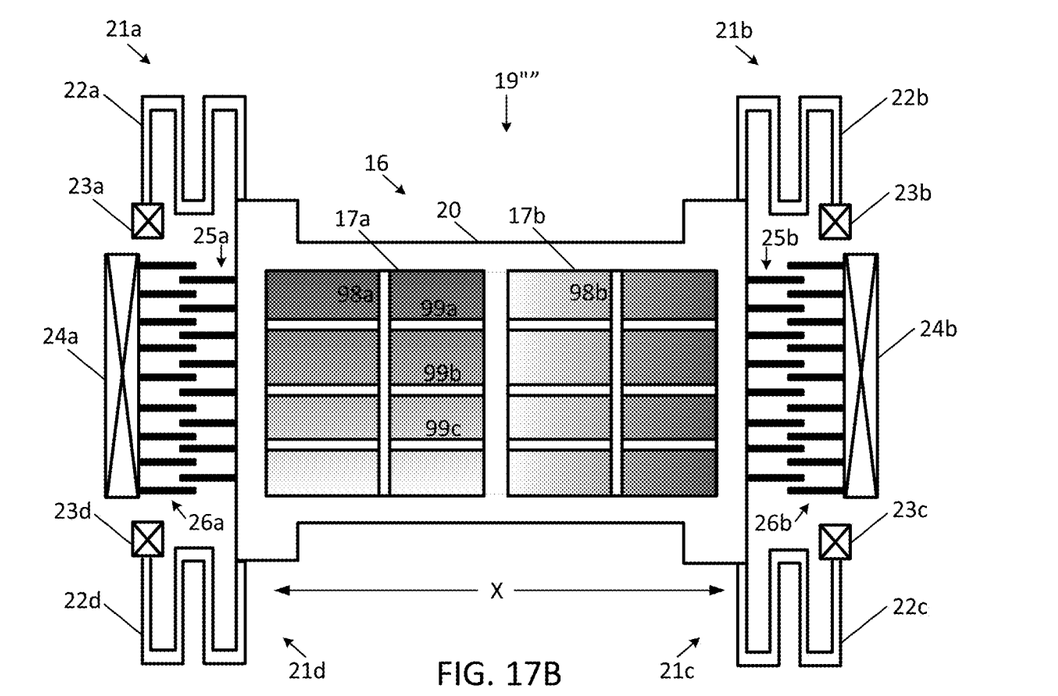
FIG. 17B is a top view of a second possible arrangement for the layer containing the MEMS actuators and optic carrying shuttle of FIG. 16.

The reinforcing elements 99a-99c may, in addition to being different in number than shown, be different in shape than shown. For example, in the optical layer 19'''' shown in FIG. 17B, there are three such reinforcing elements 99a-99c as described above that extend across the x-axis from a first end of the shuttle 20 to a second end of the shuttle 20, and there also are two reinforcing elements 98a and 98b extending across the y-axis from a first side of the shuttle 20 to a second side of the shuttle 20.

Figure 17C:
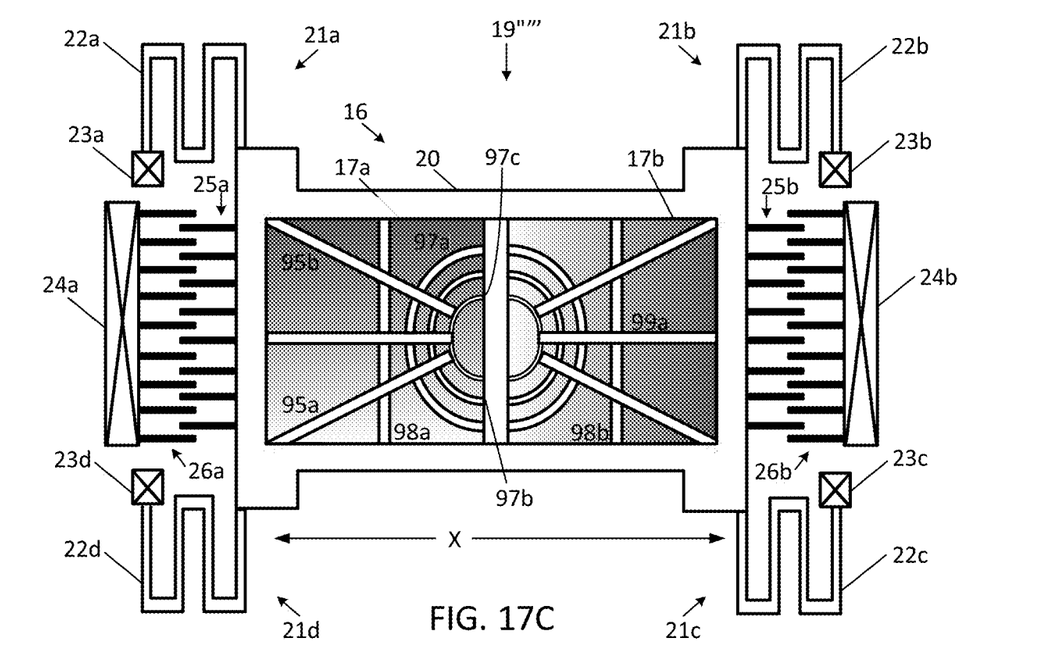
FIG. 17C is a top view of a third possible arrangement for the layer containing the MEMS actuators and optic carrying shuttle of FIG. 16.

As another example, in the optical layer 19''''' shown in FIG. 17C, there is one reinforcing element 99a extending across the x-axis from the first end of the shuttle 20 to the second end of the shuttle, two reinforcing elements 98a and 98b extending across the y-axis from a first side of the shuttle 20 to a second side of the shuttle 20, a first circular reinforcing element 97a having its origin point at the center of the metalens 17, a second circular reinforcing element 97b also having its origin point at the center of the metalens 17 and being concentric to the first circular reinforcing element 97a, and a third circular reinforcing element 97c also having its origin point at the center of the metalens 17 and being concentric to the second circular reinforcing element 97b. As illustrated, the first circular reinforcing element 97a has a larger radius than the second reinforcing element 97b, but not so great that the first circular reinforcing element 97b crosses the reinforcing elements 98a and 98b. As also illustrated, the second circular reinforcing element 97b has a larger radius than the third circular reinforcing element 97c. Reinforcing elements 95a and 95b extend diagonally across the metalens 17 in a criss-cross fashion such that they cross from corner to corner thereof, crossing the center of the metalens 17 along the way.

It should be appreciated that the illustrated arrangements for the reinforcing elements are simply examples. Indeed, appreciate that any suitable arrangement and number of reinforcing elements may be utilized, and may be formed by selectively removing portions of the moving portion 16 during formation to form the desired number and arrangement of reinforcing elements.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An optical module, comprising:
   a substrate;
   an optical detector carried by the substrate;
   a laser emitter carried by the substrate;
   a support structure carried by the substrate; and
   an optical layer comprising:
      a fixed portion carried by the support structure;
      a movable portion affixed between opposite sides of the fixed portion by a spring structure;
      a lens system carried by the movable portion;
      wherein the movable portion has at least one opening defined therein across which the lens system extends, with at least one supporting portion extending across the at least one opening to support the lens system; and
      a MEMS actuator for in-plane movement of the movable portion with respect to the fixed portion.

2. The optical module of claim 1, wherein the at least one supporting portion extends parallel to an axis of movement of the movable portion.

3. The optical module of claim 1, wherein the at least one supporting portion comprises a plurality of supporting portions.

4. The optical module of claim 3, wherein the plurality of supporting portions include at least some supporting portions extending parallel to an axis of movement of the movable portion.

5. The optical module of claim 4, wherein the plurality of supporting portions include at least some other supporting portions extending perpendicular to an axis of the movement of the movable portion.

6. The optical module of claim 3, wherein the plurality of supporting portions include at least some supporting portions extending antiparallel to an axis of movement of the movable portion.

7. The optical module of claim 3, wherein the plurality of supporting portions include at least some supporting portions extending elliptically about a central point of the lens system.

8. The optical module of claim 1, wherein the MEMS actuator comprises:
   a comb drive comprising:
      a first comb structure extending from the fixed portion to interdigitate with a second comb structure extending from the movable portion; and
      actuation circuitry configured to apply voltages to the first and second comb structures to cause the movable portion of the optical layer to oscillate back and forth between opposite sides of the fixed portion such that at a first travel limit the movable portion of the optical layer is closer to the a first side of the fixed portion than to a second side of the fixed portion, and such that at a second travel limit the movable portion of the optical layer is closer to the second side of the fixed portion than to the first side of the fixed portion.

9. The optical module of claim 1, wherein the MEMS actuator comprises:
   a first comb structure extending from a first side of the fixed portion to interdigitate with a second comb structure extending from an adjacent side of the movable portion;

a third comb structure extending from a second side of the fixed portion to interdigitate with a fourth comb structure extending from an adjacent side of the movable portion; and actuation circuitry configured to apply voltages to the first, second, third, and fourth comb structures to cause the movable portion of the optical layer to oscillate back and forth between opposite sides of the fixed portion such that at a first travel limit the movable portion of the optical layer is closer to a first side of the fixed portion than to a second side of the fixed portion, and such that at a second travel limit the movable portion of the optical layer is closer to the second side of the fixed portion than to the first side of the fixed portion.

10. The optical module of claim 1, wherein the spring structure is a MEMS spring structure.

11. The optical module of claim 1, wherein the fixed portion, movable portion, at least one supporting portion, and spring structure are integrally formed as a monolithic unit.

12. The optical module of claim 1, further comprising an encapsulating layer carried by the fixed portion and overlying the lens system.

13. The optical module of claim 1, wherein the lens system comprises a metasurface optic.

14. The optical module of claim 1, wherein the lens system is comprised of an objective lens and a beam shaping lens spaced apart from the objective lens.

15. The optical module of claim 1, wherein the movable portion is comprised of a shuttle carrying the lens system, with the spring structure comprising first, second, third, and fourth flexures respective extending from different corners of the shuttle to anchor at different corners of the fixed portion.

16. The optical module of claim 15, wherein the first, second, third, and fourth flexures are S-shaped.

17. The optical module of claim 15, wherein the shuttle is comprised of a first shuttle portion carrying an objective lens portion of the lens system, a second shuttle portion carrying a beam shaping lens portion of the lens system, and a connector portion extending between the first and second shuttle portions, a width of the connector portion being less than a width of the first and second shuttle portions.

18. The optical module of claim 17, wherein the shuttle has first and second openings defined therein over which the objective lens portion and the beam shaping lens portion are disposed.

19. The optical module of claim 15, wherein the shuttle is comprised of first and second spaced apart shuttle portions.

20. The optical module of claim 1, further comprising an additional glass substrate carried by the support structure, the additional glass substrate carrying the optical layer.

21. An optical module, comprising:
a substrate;
an optical circuit carried by the substrate; and
an optical layer comprising:
a fixed portion carried by the substrate;
a movable portion affixed between opposite sides of the fixed portion by a spring structure;
a lens system carried by the movable portion, the lens system being aligned with the optical circuit;
wherein the movable portion has at least one opening defined therein across which the lens system extends, with at least one supporting portion extending across the at least one opening to support the lens system;
a comb drive formed by respective features of the fixed portion and movable portion; and
actuation circuitry configured to apply a drive signal to the comb drive to thereby cause electrostatic actuation to the comb drive resulting in the movable portion of the optical layer oscillating back and forth between opposite sides of the fixed portion.

22. The optical module of claim 21, wherein the at least one supporting portion extends parallel to an axis of movement of the movable portion.

23. The optical module of claim 21, wherein the at least one supporting portion comprises a plurality of supporting portions.

24. The optical module of claim 23, wherein the plurality of supporting portions include at least some supporting portions extending parallel to an axis of movement of the movable portion.

25. The optical module of claim 24, wherein the plurality of supporting portions include at least some other supporting portions extending perpendicular to an axis of the movement of the movable portion.

* * * * *